United States Patent [19]
Marathe et al.

[11] Patent Number: 6,100,101
[45] Date of Patent: Aug. 8, 2000

[54] SENSITIVE TECHNIQUE FOR METAL-VOID DETECTION

[75] Inventors: Amit P. Marathe, Santa Clara; Nguyen D. Bui, San Jose; Van Pham, Milpitas, all of Calif.

[73] Assignee: Advanced Micro Devices Inc., Sunnyvale, Calif.

[21] Appl. No.: 09/179,172

[22] Filed: Oct. 27, 1998

[51] Int. Cl.$^7$ ..................................... G01R 31/26
[52] U.S. Cl. ...................... 438/14; 436/7; 148/DIG. 162; 374/5; 374/57
[58] Field of Search .................................. 438/14, 7, 16, 438/660; 375/5, 57; 148/DIG. 162

[56] References Cited

U.S. PATENT DOCUMENTS

| | | | |
|---|---|---|---|
| 5,019,533 | 5/1991 | Cuddihy et al. | 438/660 |
| 5,264,377 | 11/1993 | Chesire et al. | 438/11 |
| 5,497,076 | 3/1996 | Kuo et al. | 324/158.1 |
| 5,505,017 | 4/1996 | Yue et al. | 374/5 |
| 5,930,587 | 7/1999 | Ryan | 438/14 |

*Primary Examiner*—John F. Niebling
*Assistant Examiner*—John Murphy
*Attorney, Agent, or Firm*—Foley & Lardner

[57] ABSTRACT

A categorization of a particular semiconductor wafer based on void size is obtained from sigma data and T0.1% failure data that has been obtained from wafers subjected to isothermal testing. The sigma data and the T0.1% failure data for the particular wafer is compared to stored data corresponding to ranges for sigma and T0.1% data for each of a plurality of void categories, and the particular wafer is categorized based on the stored data. The T0.1% failure data is computed based on a T50% failure data and the sigma value, so that small sample sizes can be utilized to obtain the stored data.

18 Claims, 3 Drawing Sheets

SAMPLE SIZE: 16   SAMPLE MEAN= 75.1953   SAMPLE MEDIAN= 63.30
TOTAL SAMPLES: 16   STD. DEVIATION= 45.9837   SIGMA= 0.65

CALCULATED FALL TIME OF THE POPULATION (SEC):
T0.001= 8.39   T0.159= 32.91   T0.4= 53.63   T0.7= 89.28    T0.99= 290.01
T0.01= 13.83   T0.2= 36.50    T0.5= 63.30   T0.8= 109.86   T0.999= 477.75
T0.1= 27.73    T0.3= 44.91    T0.6= 74.77   T0.9= 146.49

CONFIDENCE INTERVALS FOR THE MEAN:        LINE FIT:
     MIN VAL   MAX VAL         SLOPE     INTERCEPT
0.8    60.48     89.91          1.92       8.37
0.9    56.28     94.11
0.95   52.66     97.73
0.99   45.54    104.85

FIG. 2

| VOID CATEGORY | # OF SAMPLES | T$_{50\%}$ (SEC) | | | SIGMA | | | T$_{0.1\%}$ (SEC) | | |
|---|---|---|---|---|---|---|---|---|---|---|
| | | MEAN | LOWER BOUND | UPPER BOUND | MEAN | LOWER BOUND | UPPER BOUND | MEAN | LOWER BOUND | UPPER BOUND |
| 1 (ACCEPTABLE) | 11 | 217.9 | 150.5 | 280.8 | 0.33 | 0.16 | 0.48 | 94.35 | 65 | 123 |
| 2 (MARGINAL) | 7 | 187.06 | 107.1 | 266.3 | 0.67 | 0.47 | 0.87 | 27.87 | 0 | 66 |
| 3 (SEVERE) | 10 | 90.3 | 17.36 | 159.2 | 0.86 | 0.69 | 1.01 | 7.66 | 0 | 38 |

SENSITIVE TECHNIQUE FOR METAL-VOID DETECTION

BACKGROUND OF THE INVENTION

1. Field of the Invention

The present invention relates to a method for determining metal voids for semiconductor devices. In particular, the present invention relates to a method for categorizing semiconductor wafers based on size of metal voids in those wafers, by using two different parameters obtained from isothermal testing of wafers.

2. Description of the Related Art

Isothermal testing is performed on semiconductor wafers in order to determine the reliability of those wafers, in particular the reliability of the metal system of a semiconductor device. Isothermal testing involves accelerated stressing of a test line, where the average temperature of the test line is raised to a target temperature through joule heating. For example, a semiconductor wafer is exposed to joule heating at an accelerated temperature, to determine if the wafer is faulty.

At present, there are no accurate methods for categorizing a wafer based on the size of voids formed therein, without having to cut up the wafer and to analyze the wafer under a scanning electron microscope (SEM).

SUMMARY OF THE INVENTION

An object of the present invention is to categorize wafers based on isothermal test data obtained from the wafers.

Another object of the present invention is to categorize wafers according to void size based on a sigma value and a Tx % value that are computed from isothermal testing of the wafers.

The above-mentioned objects and other advantages may be achieved by a method for determining a void size of a semiconductor wafer. The method includes a step of obtaining test data for a plurality of semiconductor wafers, the test data corresponding to time-to-fail for the semiconductor wafers. The method also includes a step of categorizing the plurality of semiconductor wafers into a plurality of categories based on sizes of voids formed in the semiconductor wafers. From the test data obtained in the first step, the method further includes a step of determining a time when a certain percentage of the wafers have failed. From the test data obtained in the first step, the method also includes a step of determining a sigma value for the test data. From the time obtained in the third step and the sigma value obtained in the fourth step, the method further includes a step of deriving a time when x percent of the wafers have failed, x being a number less than or equal to one. The method also includes a step of categorizing the semiconductor wafer based on the sigma value obtained in the fourth step and the time derived in the fifth step.

The above-mentioned objects and other advantages of the present invention may also be achieved by a method for categorizing a particular semiconductor wafer based on void size. The method includes a step of subjecting a plurality of semiconductor wafers to isothermal testing, the plurality of semiconductor wafers not including the particular semiconductor wafer. The method also includes a step of obtaining time-to-fail data and sigma data for the plurality of semiconductor wafers subjected to the isothermal testing, the time-to-fail data being obtained for at least a certain percentage of the wafers having failed. From the time-to-fail data and the sigma data obtained in the second step, the method includes a step of computing a time when x percent of the wafers have failed, x being a number less than or equal to one. The method also includes a step of examining each of the plurality of semiconductor wafers under a microscope and categorizing each of the plurality of wafers based on sizes of voids formed in each of the plurality of semiconductor wafers. The method further includes a step of determining a range of values for the time-to-fail data and the sigma data for each of the categories in the fourth step. The method further includes a step of subjecting the particular semiconductor wafer to isothermal testing. The method also includes a step of obtaining time-to-fail data and sigma data for the particular semiconductor wafer subjected to the isothermal testing. The method still further includes a step of categorizing the particular semiconductor wafer into one of the categorizes based on the sigma data and the time-to-fail data obtained in the seventh step, and the range of values for the time-to-fail data and the sigma data obtained in the fifth step.

The above-mentioned objects and other advantages of the present invention may also be achieved by a method of categorizing a wafer based on void size. The method includes a step of subjecting the wafer to isothermal testing, the wafer being subjected to the isothermal testing along with a set of other wafers. The method also includes a step of obtaining time-to-fail data and sigma data for the wafer, based on data obtained from the isothermal testing in the first step. The method further includes a step of comparing the time-to-fail data and the sigma data for the wafer against stored ranges of time-to-fail data and stored ranges of sigma data for a plurality of void categories. The method still further includes a step of determining one of the void categories for the wafer based on the comparing performed in the third step.

BRIEF DESCRIPTION OF THE DRAWINGS

The above-mentioned objects and advantages of the invention will become more fully apparent from the following detailed description when read in conjunction with the accompanying drawings, with like reference numerals indicating corresponding parts throughout, and wherein:

FIG. 2 is a plot of sigma, T0.1% failure data, and T50% failure data for a group of 28 wafers that were subjected to isothermal testing, in order to obtain data utilized in the method according to the present invention;

DETAILED DESCRIPTION OF THE PREFERRED EMBODIMENT

A preferred embodiment of the present invention will be described in detail below with reference to the accompanying drawings. In the present invention, a group of wafers are subjected to isothermal testing. Based on data obtained from the isothermal testing of the group of wafers, a median time to fail, or T50% value, is obtained. For example, for a sample size of 100 wafers, the time it takes for the first fifty (50) wafers to fail is the T50% value.

Figure 1:
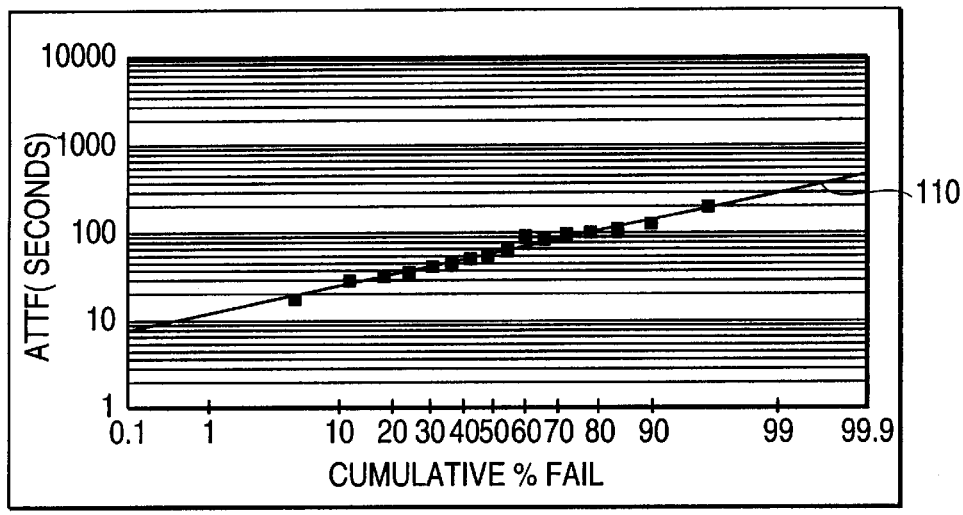
FIG. 1 is a plot explaining how a sigma value is computed from a log-normal plot of time-to-fail data of a group of wafers that experience electromigration problems.

A sigma value is also obtained from the isothermal testing of the wafers. The sigma value corresponds to the slope of a time-to-fail plot of the wafers, where the failure plot is a log-normal plot of time (logarithmic scale) versus percent of lot failing (normal scale). It is known in the art that for semiconductor electromigration, which causes voids to form and other problems in vias and trenches that correspond to conductive regions of a semiconductor device, the failure data due to electromigration tends to follow a log-normal distribution (y-axis is log scale, x-axis is normal scale). The slope of this distribution corresponds to the sigma value. The sigma value is defined as ln[T50%/T15.9%]. Such a distribution is shown in FIG. 1, where a sigma value that corresponds to the slope of the line 110 can be obtained from a plot of failure times for a set of 16 wafers. From FIG. 1, the sigma value is equal to ln[63.3/32.91]=ln[1.92]=0.65.

Electromigration, which means the movement of atoms due to the flow of electrons, or the electron wind, occurs due to the small sizes of metal contacts or vias, and where a high density current flows through these small metal contact regions. As semiconductor devices get smaller and smaller due to advances in the industry, the electromigration problem, which corresponds to the electron flow in these small-sized vias causing voids and hillocks to form, is becoming a major concern to semiconductor manufacturers.

The present invention provides for a method to accurately monitor the adequacy of wafers that are subjected to accelerated isothermal tests, so as to determine whether these wafers are suitable for use in an electronic device, such as a CPU of a personal computer.

As explained above, the T50% value for a group of wafers is obtained after isothermal testing is performed for a long enough period of time to get at least one-half of the wafers-under-test to fail. From that value, a T0.1% value can be obtained, based on the known log-normal time-to-fail characteristic of wafers that fail due primarily to electromigration. The electromigration effect causes voids to form and thereby causes problems in the electrical contacts formed in the wafer, which may result in failure of a wafer.

The T0.1% value corresponds to the time at which 0.1% of the lot size of wafers fail. Thus, for a lot size of 10,000 wafers, the T0.1% values corresponds to the time at which 10 of the 10,000 wafers have failed. The obtaining of such a value may involve the need for large lot sizes. However, due to the "known" failure characteristics of wafers that experience conductive failures due to voids that occur because of electromigration, the T50% value as well as the sigma value can be used to derive the T0.1% value.

The T0.1% value is obtained from the T50% value and the sigma value according to the following equation:

$$T0.1\% = T50\% * \exp(-3.091 * \text{sigma}).$$

The above equation is obtained based on the log-normal failure distribution of wafers.

In the present invention, the T0.1% value and the sigma value are the two parameters that are used to determine whether a particular wafer is acceptable, or whether that wafer is defective. The present inventors have recognized that the sigma and T0.1% values give a good correspondence to the absence or the presence of metal voiding in wafers, as well as the void size when voids are present.

To verify their conclusions, the present inventors performed isothermal (WLR) tests on a set of 38 wafers. Values of T50% and sigma were measured from the whole failure population in the isothermal tests, and the T0.1% value was extracted using the equation given above.

The wafers were also examined under a SEM to quantify the metal voids in terms of void size and density. The metal voids is metal-1 and metal-2 layers for all the measured wafers were ranked into three categories: a) void size <25% of metal width (acceptable), b) void size >25% and <50% of metal line (marginal), and c) void size >50% of line width (severe—no good).

FIG. 2 shows data obtained for a lot of 28 wafers subjected to isothermal testing by the inventors. The data includes SEM observations that were used to determine void category. The SEM observations were obtained by cutting each wafer in a cross-sectional direction after the isothermal testing, to thereby determine the size of the voids formed in each wafer, using a scanning electron microscope.

From this data, it was found that the void rank has a good correlation with the T0.1% data and the sigma data obtained from the isothermal testing of the wafers. The lower and upper bounds for the T50% data values, the sigma data values and the T0.1% data values represent the 95% confidence intervals for these respective values.

As seen from the data in FIG. 2, the group mean of T50% data values and T0.1% data values decrease while the group mean of the sigma values increases, as the voiding becomes more severe.

Also, as seen from the data in FIG. 2 and further statistical analysis performed by the present inventors, the sigma values and the T0.1% values are suitable criteria for screening lots according to void severity. The difference in the values for sigma and T0.1% between different void categories is statistically significant without much overlap. For the T50% values, however, an analysis of variance (ANOVA) model that was performed by the inventors shows a poorer statistical fit to the data as compared to that for the T0.1% values and the sigma values.

Figure 3:
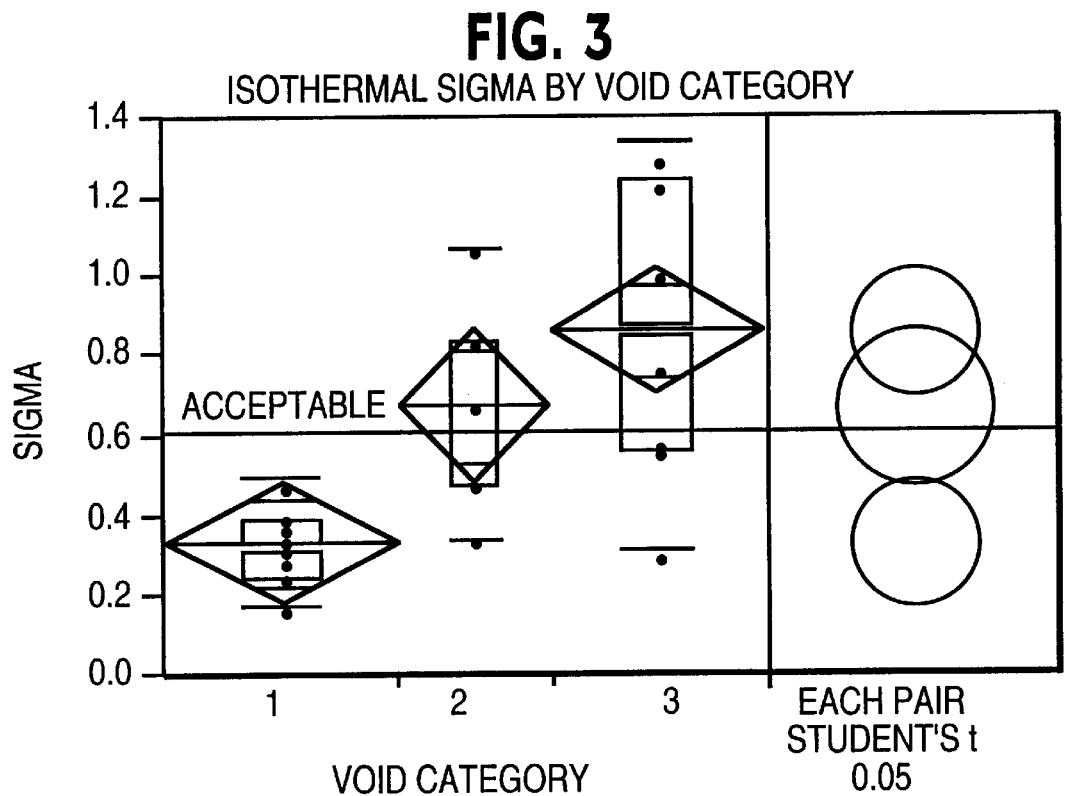
FIG. 3 is a plot of void ranges for a group of wafers being subjected to isothermal testing, where sigma is used as a parameter in determining void categorization.

FIG. 3 is a plot of the ranges that were obtained from the 28-wafer sample size for acceptable, marginal and severe (poor) wafers, using the sigma values as a criteria for determining void categorization of wafers.

Figure 4:
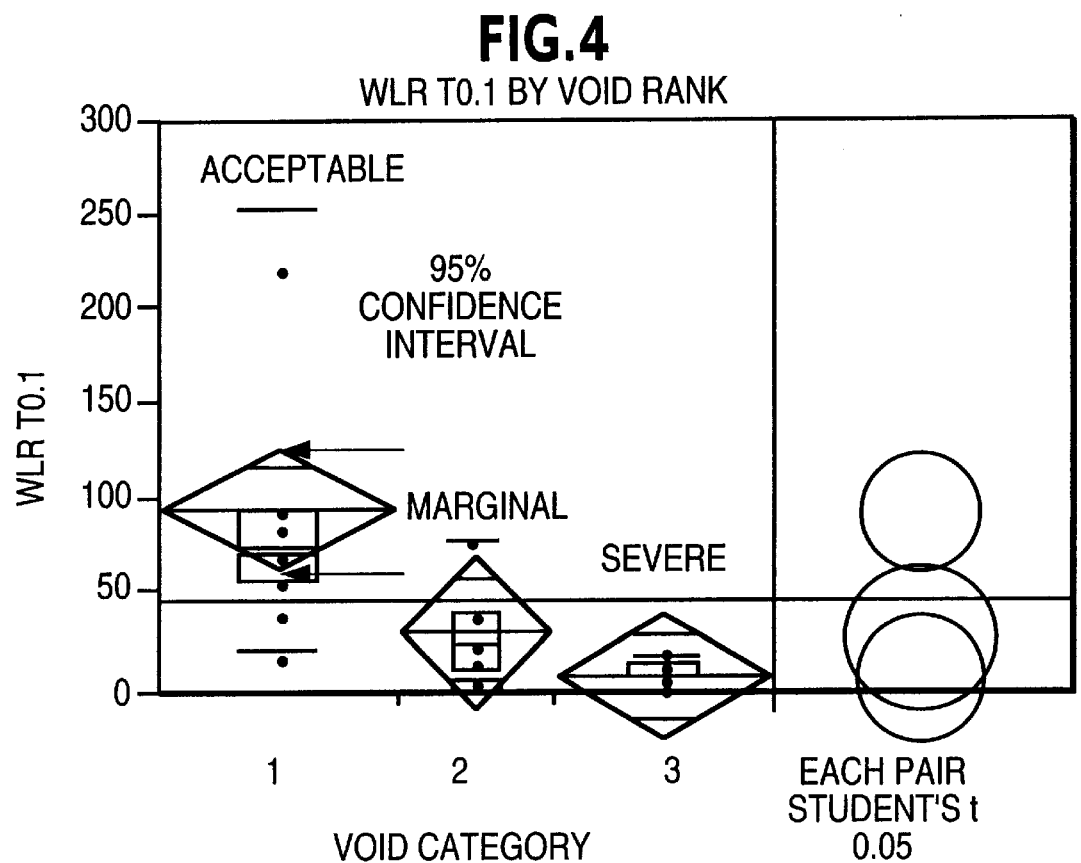
FIG. 4 is a plot of void ranges for a group of wafers being subjected to isothermal testing, where T0.1% is used as a parameter in determining void categorization.

FIG. 4 is a plot of the ranges that were obtained from the 38-wafer sample size for acceptable, marginal and severe wafers, using the T0.1% values as a criteria for determining void categorization of wafers.

The diamond regions shown in FIGS. 3 and 4 are a schematic of the mean and standard error of the mean for each sample group, and the line across each diamond represents the group mean. The height of each diamond represents the 95% confidence interval for each group, and the diamond width represents the group size. For example, the group size of the "marginal" wafers corresponds to 7 out of the 28 wafers, and thus has a corresponding diamond region having a smaller width than the other two diamond regions in FIGS. 3 and 4. The data plots in FIGS. 3 and 4 correlate to the data provided in FIG. 2.

Analysis of variance data for "sigma" is given in Tables 1 and 2, and analysis of variance data for "T0.1%" is given in Tables 3 and 4, listed below. The analysis of variance data includes the sum of squares and mean square for the model and the residual error. The F-ratio is a measure of effectiveness of the model. Higher values for the F-ratio mean better effectiveness. The value of Prob>F is a measure of the statistical fit to the data. Smaller values for this parameter mean a better statistical fit.

TABLE 1

One Way Analysis of Variance Data for Sigma

| | |
|---|---|
| RSquare | 0.479325 |
| RSquare Adj | 0.437671 |
| Root Mean Square Error | 0.259722 |
| Mean of Response | 0.606429 |
| Observations (or Sum Wgts) | 28 |

TABLE 2

Analysis of Variance Data for Sigma

| Source | DF | Sum of Squares | Mean Square | F Ratio |
|---|---|---|---|---|
| Model | 2 | 1.5524578 | 0.776229 | 11.5073 |
| Error | 25 | 1.6863851 | 0.067455 | Prob > F |
| C Total | 27 | 3.2388429 | 0.119957 | 0.0003 |

TABLE 3

One Way Analysis of Variance Data for T0.1%

| | |
|---|---|
| RSquare | 0.408512 |
| RSquare Adj | 0.361193 |
| Root Mean Square Error | 49.72985 |
| Mean of Response | 46.775 |
| Observations (or Sum Wgts) | 28 |

TABLE 4

Analysis of Variance Data for T0.1%

| Source | DF | Sum of Squares | Mean Square | F Ratio |
|---|---|---|---|---|
| Model | 2 | 42700.45 | 21350.2 | 8.6331 |
| Error | 25 | 61826.45 | 2473.1 | Prob > F |
| C Total | 27 | 104526.91 | 3871.4 | 0.0014 |

Tables 5 and 6 give the means and standard error for the sigma data, and Tables 7 and 8 give the means and standard error for the T0.1% data. Tables 6 and 8 show the difference in means between the respective three categories for the T0.1% data and the sigma data, respectively.

TABLE 5

Means for One Way Analysis of Variance - Sigma

| Category | Number | Mean | Std. Error |
|---|---|---|---|
| 1 | 11 | 0.328182 | 0.07831 |
| 2 | 7 | 0.674286 | 0.09817 |
| 3 | 10 | 0.865000 | 0.08213 |

TABLE 6

Standard Error - Sigma

| Dif = Mean(i) | Mean Comparisons | | |
|---|---|---|---|
| − Mean(j) | 3 | 2 | 1 |
| 3 | 0.000000 | 0.190714 | 0.536818 |
| 2 | −0.19071 | 0.000000 | 0.346104 |
| 1 | −0.53682 | −0.3461 | 0.000000 |

TABLE 7

Means for One Way Analysis of Variance - T0.1%

| Category | Number | Mean | Std. Error |
|---|---|---|---|
| 1 | 11 | 94.3564 | 14.994 |
| 2 | 7 | 27.8771 | 18.796 |
| 3 | 10 | 7.6640 | 15.726 |

TABLE 8

Standard Error - T0.1%

| Dif = Mean(i) | Mean Comparisons | | |
|---|---|---|---|
| − Mean(j) | 3 | 2 | 1 |
| 1 | 0.000000 | 66.4792 | 86.6924 |
| 2 | −66.4792 | 0.000000 | 20.2131 |
| 3 | −86.6924 | −20.2131 | 0.00000 |

Tables 9 and 10 show the absolute value of the difference between means of the respective categories, subtracted by the least significant difference, for the T0.1% data and the sigma data, respectively.

TABLE 9

Comparisons for Each Pair Using Student's t - Sigma
t = 2.05952

| Abs(Dif) − LSD | 3 | 2 | 1 |
|---|---|---|---|
| 3 | −0.23922 | −0.07289 | 0.303102 |
| 2 | −0.07289 | −0.028592 | 0.087482 |
| 1 | 0.303102 | 0.087482 | −0.22808 |

TABLE 10

Comparisons for Each Pair Using Student's t - T0.1%
t = 2.05952

| Abs(Dif) − LSD | 3 | 2 | 1 |
|---|---|---|---|
| 1 | −43.6719 | 16.9599 | 41.9420 |
| 2 | 16.9599 | −54.7456 | −30.2598 |
| 3 | 41.9420 | −30.2598 | −45.8035 |

The t-test data in Tables 9 and 10 gives a comparison of each pair of categories with respect to the difference between their means and the least significant difference (LSD) of the comparison circles shown in FIGS. 3 and 4. The LSD is the difference between two group means at which the outside angle of intersection of the corresponding comparison circles is equal to 90 degrees. Circles for means that are significantly different either do not intersect or intersect slightly so that the outside angle of intersection is less than 90 degrees. If the circles intersect by an angle of more than 90 degrees or if they are nested, the means are not significantly different. As seen from FIGS. 3 and 4, the circles for categories a) and b) for the T0.1% data do not intersect, while the circles for the categories b) and c) overlap by a fairly large extent.

Also, as seen from FIGS. 3 and 4, the circles for categories a) and b) for the sigma values intersect only slightly, and the circles for categories b) and c) intersect marginally.

A positive value for the difference, Abs (Dif)−LSD, shows that a pair of means are significantly different from each other, where Dif=Mean(i)−Mean(j), where i and j are two different categories. Thus, from the t-test table, the difference in the group means between the different void categories is statistically significant. For void categories 2 and 3, the 95% confidence intervals do overlap somewhat. However, there is negligible overlap between confidence intervals for category 1 with those for categories 2 and 3. Thus, by using the T0.1% parameter and the sigma parameter, one can make an accurate determination as to whether a wafer that has been exposed to isothermal testing is acceptable or not.

While a preferred embodiment has been described herein, modification of the described embodiment may become apparent to those of ordinary skill in the art, following the teachings of the invention, without departing from the scope of the invention as set forth in the appended claims.

For example, while the present invention has been described above with reference to the use of the sigma values and the T0.1% values, other failure percentage values may be utilized with the sigma value instead of the T0.1% value. For example, if the T1.0% value and the sigma value are used to determine void categorization of wafers, then a less conservative determination of wafer acceptability will be made with respect to isothermal testing. If the T0.01% value and the sigma value are used, then a more conservative determination of wafer acceptability is made with respect to isothermal testing. For these other failure values, a different equation than the one given above would be utilized, but such equations for log-normal distribution are known to those of ordinary skill in the art, or can readily be derived.

What is claimed is:

1. A method for determining a void size of a semiconductor wafer, the method comprising the steps of:
    a) obtaining test data for a plurality of semiconductor wafers, the test data corresponding to time-to-fail for the semiconductor wafers;
    b) categorizing the plurality of semiconductor wafers into a plurality of categories based on sizes of voids formed in the semiconductor wafers;
    c) from the test data obtained in the step a), determining a time when a certain percentage of the wafers have failed;
    d) from the test data obtained in the step a), determining a sigma value for the test data;
    e) from the time obtained in the step c) and the sigma value obtained in the step d), deriving a time when x percent of the wafers have failed, x being a number less than or equal to one; and
    f) categorizing the semiconductor wafer based on the sigma value obtained in the step d) and the time derived in the step e).

2. The method according to claim 1, wherein the step b) is performed by cutting each of the wafers to obtain a cross-sectional view of each of the wafers, and placing the cut wafers under a microscope to determine sizes of the voids formed therein.

3. The method according to claim 1, wherein the certain percentage is 50%.

4. The method according to claim 3, wherein x is 0.1.

5. The method according to claim 3, wherein x is 0.01.

6. The method according to claim 3, wherein x is 1.0.

7. The method according to claim 1, wherein the wafer is categorized into at least an acceptable void size and an unacceptable void size.

8. The method according to claim 1, wherein the wafer is categorized in the step f) without cutting the wafer, and wherein a visual inspection of the wafer is not performed during the categorization of the wafer in the step f).

9. A method for categorizing a particular semiconductor wafer based on void size, the method comprising the steps of:
    a) subjecting a plurality of semiconductor wafers to isothermal testing, the plurality of semiconductor wafers not including the particular semiconductor wafer;
    b) obtaining time-to-fail data and sigma data for the plurality of semiconductor wafers subjected to the isothermal testing, the time-to-fail data being obtained for at least a certain percentage of the wafers having failed;
    c) from the time-to-fail data and the sigma data obtained in the step b), computing a time when x percent of the wafers have failed, x being a number less than or equal to one;
    d) examining each of the plurality of semiconductor wafers under a microscope and categorizing each of the plurality of wafers based on sizes of voids formed in each of the plurality of semiconductor wafers;
    e) determining a range of values for the time-to-fail data and the sigma data for each of the categories in the step d);
    f) subjecting the particular semiconductor wafer to isothermal testing;
    g) obtaining time-to-fail data and sigma data for the particular semiconductor wafer subjected to the isothermal testing; and
    h) categorizing the particular semiconductor wafer into a catergory based on the sigma data and the time-to-fail data obtained in the step g), and the range of values for the time-to-fail data and the sigma data obtained in the step e).

10. The method according to claim 9, wherein the step d) is performed by cutting each of the plurality of wafers to obtain a cross-sectional view of each of the plurality of wafers, and placing the cut wafers under a microscope to determine sizes of the voids formed therein.

11. The method according to claim 9, wherein the certain percentage is 50%.

12. The method according to claim 11, wherein x is 0.1.

13. The method according to claim 11, wherein x is 0.01.

14. The method according to claim 11, wherein x is 1.0.

15. The method according to claim 9, wherein the particular wafer is categorized without cutting the particular wafer, and
    wherein a visual inspection of the particular wafer is not performed during the categorization of the particular wafer.

16. The method according to claim 9, further comprising the step of determining the value x used in the step c) based on a degree of conservatism in the categorization of the particular wafer.

17. The method according to claim 1, wherein the particular wafer is categorized into at least an acceptable void size and an unacceptable void size.

18. A method of categorizing a wafer based on void size, the method comprising the steps of:
    a) subjecting the wafer to isothermal testing, the wafer being subjected to the isothermal testing along with a set of other wafers;
    b) obtaining time-to-fail data and sigma data for the wafer, based on data obtained from the isothermal testing in the step a);

c) comparing the time-to-fail data and the sigma data for the wafer against stored ranges of time-to-fail data and stored ranges of sigma data for a plurality of void categories; and d) determining one of the void categories for the wafer based on the comparing performed in the step c).

* * * * *